(12) United States Patent
Chang et al.

(10) Patent No.: US 12,543,549 B2
(45) Date of Patent: Feb. 3, 2026

(54) METHOD OF OVERLAY MEASUREMENT

(71) Applicant: TAIWAN SEMICONDUCTOR MANUFACTURING COMPANY, LTD., Hsinchu (TW)

(72) Inventors: Shih-Yu Chang, Yunlin County (TW); Chien-Han Chen, Nantou County (TW); Chien-Chih Chiu, Tainan (TW); Chi-Che Tseng, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 990 days.

(21) Appl. No.: 17/589,575

(22) Filed: Jan. 31, 2022

(65) Prior Publication Data

US 2023/0028904 A1   Jan. 26, 2023

Related U.S. Application Data

(60) Provisional application No. 63/224,987, filed on Jul. 23, 2021.

(51) Int. Cl.
*H01L 23/522*    (2006.01)
*G03F 7/00*    (2006.01)
*H01L 21/311*    (2006.01)
*H01L 21/768*    (2006.01)
*H01L 23/532*    (2006.01)

(52) U.S. Cl.
CPC ...... *H01L 23/5226* (2013.01); *G03F 7/70633* (2013.01); *H01L 21/31144* (2013.01); *H01L 21/76802* (2013.01); *H01L 21/76831* (2013.01); *H01L 23/53238* (2013.01)

(58) Field of Classification Search
CPC ............ G03F 7/70633; H01L 23/5226; H01L 21/31144; H01L 21/76802; H01L 21/7681
See application file for complete search history.

(56) References Cited

U.S. PATENT DOCUMENTS

| | | | | |
|---|---|---|---|---|
| 9,373,543 B1* | 6/2016 | Mont | ................ | H01L 21/76816 |
| 9,793,183 B1* | 10/2017 | Ho | ....................... | G03F 7/70633 |
| 2018/0151422 A1* | 5/2018 | Tsai | ................ | H01L 21/76832 |
| 2018/0175016 A1* | 6/2018 | Kim | ..................... | G03F 7/70683 |

* cited by examiner

*Primary Examiner* — Bac H Au
(74) *Attorney, Agent, or Firm* — Maschoff Brennan

(57) ABSTRACT

A method includes depositing an inter-metal dielectric (IMD) layer over a conductive line. A via opening is formed in the IMD layer and directly over the conductive line. A width of the conductive line is greater than a width of the via opening. An overlay measurement is performed. The overlay measurement includes obtaining a backscattered electron image of the via opening and the conductive line and determining an overlay between the via opening and the conductive line according to the backscattered electron image.

20 Claims, 18 Drawing Sheets

METHOD OF OVERLAY MEASUREMENT

PRIORITY CLAIM AND CROSS-REFERENCE

This application claims priority to U.S. Provisional Application Ser. No. 63/224,987, filed Jul. 23, 2021, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, lithography is a technique frequently used in IC manufacturing for transferring IC designs to a semiconductor substrate. A typical lithography process includes coating a resist (or photo resist) over the substrate, exposing the resist to a radiation such as extreme ultraviolet (EUV) ray, and developing and partially stripping the resist to leave a patterned resist over the substrate. The patterned resist is used for subsequent etching processes in forming ICs. Advancement in lithography is generally desirable to meet the demand of the continued semiconductor miniaturization. Also, advancement in overlay techniques for the lithography results are also desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
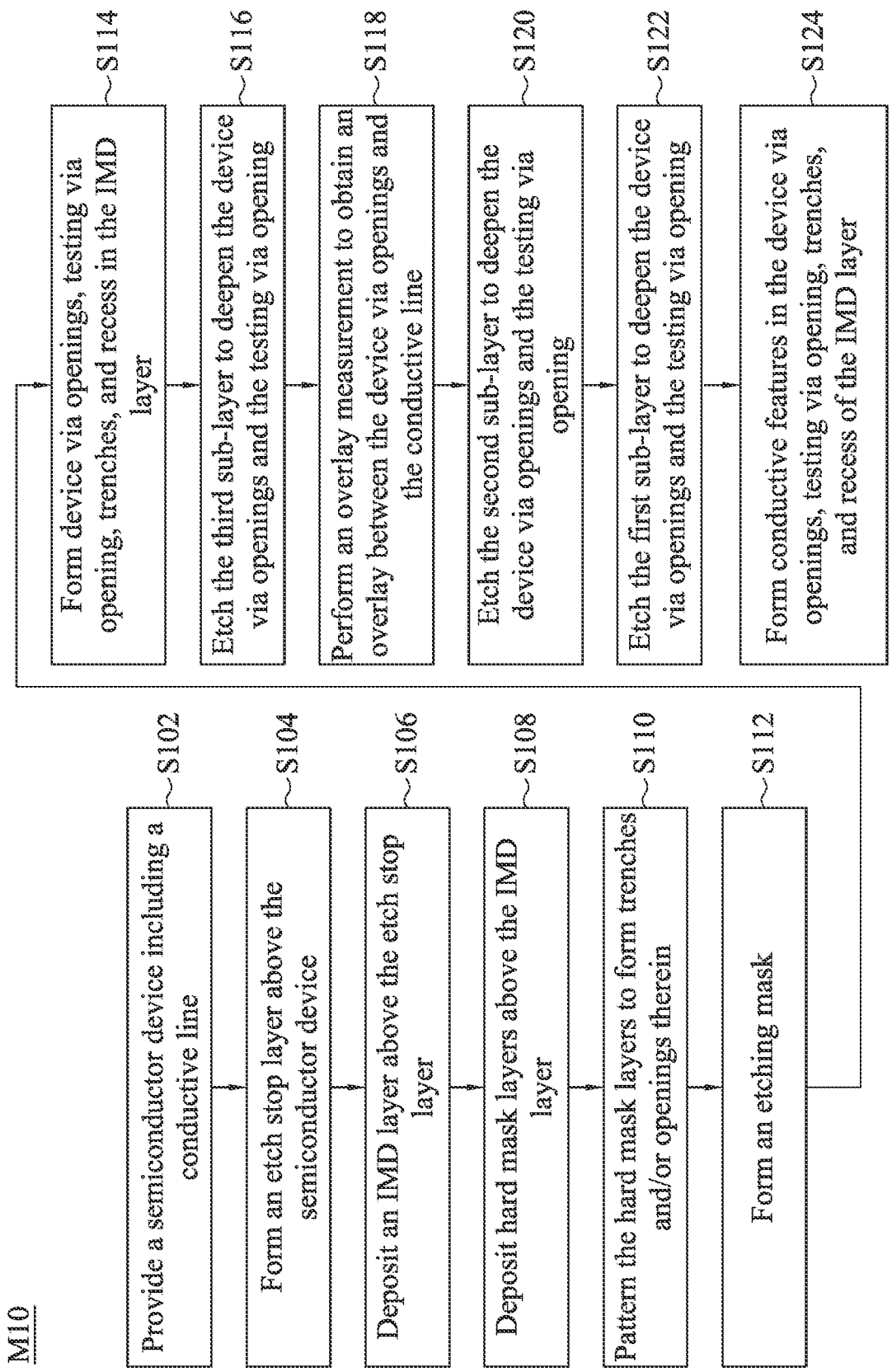
FIG. 1 is a flow chart of an example method for manufacturing an integrated circuit structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region.

The present disclosure provides example overlay measurement methods by using backscattered electron detectors for improving reliability of overlay measurements for interconnect structures of integrated circuit structures. FIG. 1 is a flow chart of an example method M10 for manufacturing an integrated circuit structure according to some embodiments. For illustrative purposes, the operations illustrated in FIG. 1 will be described with reference to the example process for manufacturing an integrated circuit structure as illustrated in FIGS. 2-11. FIGS. 2-11 illustrate a method for manufacturing an integrated circuit structure at various stages in accordance with some embodiments of the present disclosure. Methods for overlay measurements (such as method M10 in FIG. 1 and methods M20-M60 in FIGS. 14-18) may be performed for measuring the overlay between interconnection structures formed the integrated circuit structure of FIGS. 2-11. Operations can be performed in a different order or not performed depending on specific applications. It should be noted that the method shown in FIGS. 2-11 may not produce a complete integrated circuit structure. Accordingly, it is understood that additional processes can be provided before, during, and/or after the method shown in FIGS. 2-11, and that some other processes may only be briefly described herein.

In some embodiments, the integrated circuit structure shown in FIGS. 2-11 may include intermediate devices fabricated during processing of an integrated circuit (IC), or a portion thereof, that may include static random access memory (SRAM), logic circuits, spintronic devices, passive components and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
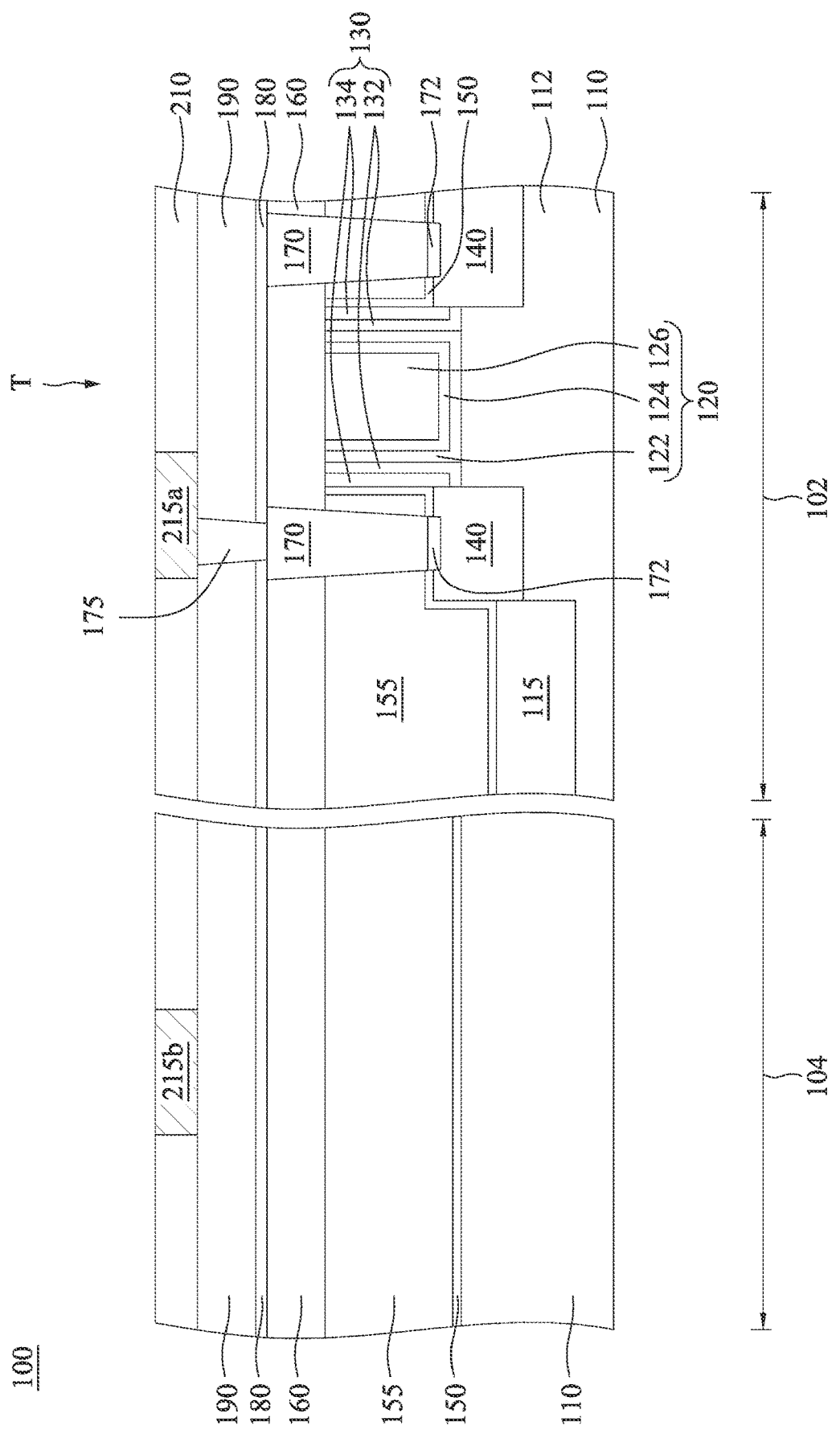
FIGS. 2-11 illustrate a method for manufacturing an integrated circuit structure at various stages in accordance with some embodiments of the present disclosure.

Reference is made to FIGS. 1 and 2. In operation S102 of the method M10, a semiconductor device including a conductive line is provided. For example, as shown in FIG. 2, a semiconductor device 100 is provided. The semiconductor device 100 includes a substrate 110 having a device region 102 and a periphery region 104 adjacent to the device region 102. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

A least one device is formed over the substrate 110. For example, a transistor T is formed over the device region 102 of the substrate 110. One or more semiconductor fin 112 of the transistor T is formed on the substrate 110. The semiconductor fin 112 may be N-type or P-type. The semiconductor fin 112 may be formed by performing an etching process to the substrate 110. Isolation structures 115, such as shallow trench isolations (STI), are then formed on the substrate 110 and surround a bottom portion of the semiconductor fin 112.

The transistor T further includes a gate structure 120 over the semiconductor fin 112. The gate structure 120 includes a gate dielectric layer 122 and a gate electrode over the gate dielectric layer 122. The gate electrode may include a work function metal layer 124 formed over the gate dielectric layer 122 and a fill metal 126 formed over the work function metal layer 124. The gate dielectric layer 122 includes an interfacial layer (e.g., silicon oxide layer) and a high-k gate dielectric layer over the interfacial layer. In some embodiments, the interfacial layer of the gate dielectric layer 122 may include a dielectric material such as silicon oxide ($SiO_2$), HfSiO, or silicon oxynitride (SiON). The high-k dielectric layer of the gate dielectric layer 122 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The work function metal layer 124 and/or fill metal 126 used within gate structure 120 may include a metal, metal alloy, or metal silicide. The work function metal layer 124 may include titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), titanium nitride (TiN), tungsten nitride (WN), tungsten (W), ruthenium (Ru), palladium (Pd), platinum (Pt), cobalt (Co), nickel (Ni), aluminides, conductive metal oxides, and/or other suitable materials. In some embodiments, the fill metal 126 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The transistor T further includes gate spacers 130 at least on opposite sidewalls of the gate structure 120. In some embodiments, the gate spacers 130 each includes multiple layers, such as a first spacer layer 132 and a second spacer layer 134 formed over the first spacer layer 132. The first and second spacer layers 132 and 134 each are made of a suitable material such as silicon oxide, silicon nitride, silicon carbide, silicon oxynitride, SiCN, silicon oxycarbide, SiOCN, and/or combinations thereof.

The transistor T further includes source/drain epitaxial structures 140 on opposite sides of the gate structure 120. In some embodiments, formation of the source/drain epitaxial structures 140 includes recessing source/drain regions of the semiconductor fin 112, followed by epitaxially growing semiconductor materials in the recessed source/drain regions of the semiconductor fin 112. In some embodiments, the source/drain epitaxial structures 140 include Ge, Si, GaAs, AlGaAs, SiGe, GaAsP, SiP, or other suitable material.

It is noted that although the transistor T is a FinFET in FIG. 2, the transistor T may be a planar FET, a horizontal gate-all-around (HGAA) FET, a vertical gate-all-around (VGAA) FET, or other types of transistors. Further, the devices formed over the substrate 110 may be capacitors, resistors, diodes, photo-diodes, fuses, and the like. The functions of the devices may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The semiconductor device 100 further includes a contact etch stop layer (CESL) 150, a first interlayer dielectric (ILD) layer 155 on the CESL 150, and a second ILD layer 160 on the first ILD layer 155 and the gate structure 120. In some embodiments, the CESL 150 includes a silicon nitride layer, a silicon oxynitride layer, and/or other suitable materials having a different etch selectivity than the first ILD layer 155 and the second ILD layer 160. In some embodiments, the first ILD layer 155 and the second ILD layer 160 each includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 150.

A plurality of source/drain contacts 170 are formed extending through the first ILD layer 155 and the second ILD layer 160 and are electrically connected to the source/drain epitaxial structures 140. Formation of the source/drain contacts 170 includes, by way of example and not limitation, performing one or more etching processes to form contact openings extending though the first ILD layer 155, the second ILD layer 160, and the CESL 150 to expose the source/drain epitaxial structures 140, depositing one or more metal materials overfilling the contact openings, and then performing a CMP process to remove excessive metal materials outside the contact openings. In some embodiments, the source/drain contacts 170 are made of metal, such as W, Co, Ru, Al, Cu, or other suitable materials. In some embodiments, barrier layers are formed in the contact openings before the formation of the source/drain contacts 170. The barrier layers may be made of TiN, TaN, or combinations thereof.

In some embodiments, metal alloy layers 172 are respectively formed above the source/drain epitaxial structures 140 prior to forming the source/drain contacts 170. The metal alloy layers 172, which may be silicide layers, are respectively formed in the trenches and over the exposed source/drain epitaxial structures 140 by a self-aligned silicide (salicide) process. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layers 172 may include germanium.

The semiconductor device 100 further includes an etch stop layer 180 over the second ILD layer 160 and a third ILD layer 190 over the etch stop layer 180. In some embodiments, the etch stop layer 180 is formed of $SiN_x$, SiCN, $SiO_2$, CN, $AlO_xN_y$, combinations thereof, or the like, deposited by CVD or PECVD techniques. The third ILD layer 190 has a material the same as or similar to that of the first ILD layer 155.

The semiconductor device 100 further includes at least one conductive via 175 formed extending through the third ILD layer 190 and is electrically connected to one of the source/drain contacts 170. Formation of the conductive via 175 includes, by way of example and not limitation, performing one or more etching processes to form via openings extending though the third ILD layer 190 to expose one or some of the source/drain contacts 170, depositing one or more metal materials overfilling the via openings, and then performing a CMP process to remove excessive metal materials outside the via openings. In some embodiments, the conductive via 175 is made of metal, such as W, Co, Ru, Al, Cu, or other suitable materials. In some embodiments, barrier layers are formed in the via openings before the formation of the conductive via 175. The barrier layers may be made of TiN, TaN, or combinations thereof.

The semiconductor device 100 further includes a first inter-metal dielectric (IMD) layer 210 and conductive lines 215a, 215b respectively extending horizontally or laterally in the first IMD layer 210. The conductive line 215a is formed over the device region 102 of the substrate 110, and the conductive line 215b is formed over the peripheral region 104 of the substrate 110. In some embodiments, the conductive line 215a is electrically connected to the conductive via 175. In some other embodiments, the conductive line 215a is electrically connected to at least one conductive via, which is connected to some other devices formed above the substrate 110, formed in the third ILD layer 190. In some embodiments, the conductive line 215b is electrically isolated from the transistor T or other devices formed above the substrate 110. In some embodiments, the conductive line 215b is electrically connected to a dummy device or testing device formed above the peripheral region 104 of the substrate 110.

The conductive lines 215a and 215b can be formed using, for example, a single damascene process, a dual damascene process, the like, or combinations thereof. In some embodiments, the first IMD layer 210 may include low-k dielectric materials. In some embodiments, the first IMD layer 210 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive lines 215a and 215b may include metal materials such as copper, aluminum, tungsten, combinations thereof, or the like. In some embodiments, the conductive lines 215a and 215b may further include one or more barrier/adhesion layers (not shown) to protect the first IMD layer 210 from metal diffusion (e.g., copper diffusion) and metallic poisoning. The one or more barrier/adhesion layers may include titanium, titanium nitride, tantalum, tantalum nitride, or the like, and may be formed using physical vapor deposition (PVD), CVD, ALD, or the like.

Figure 3:
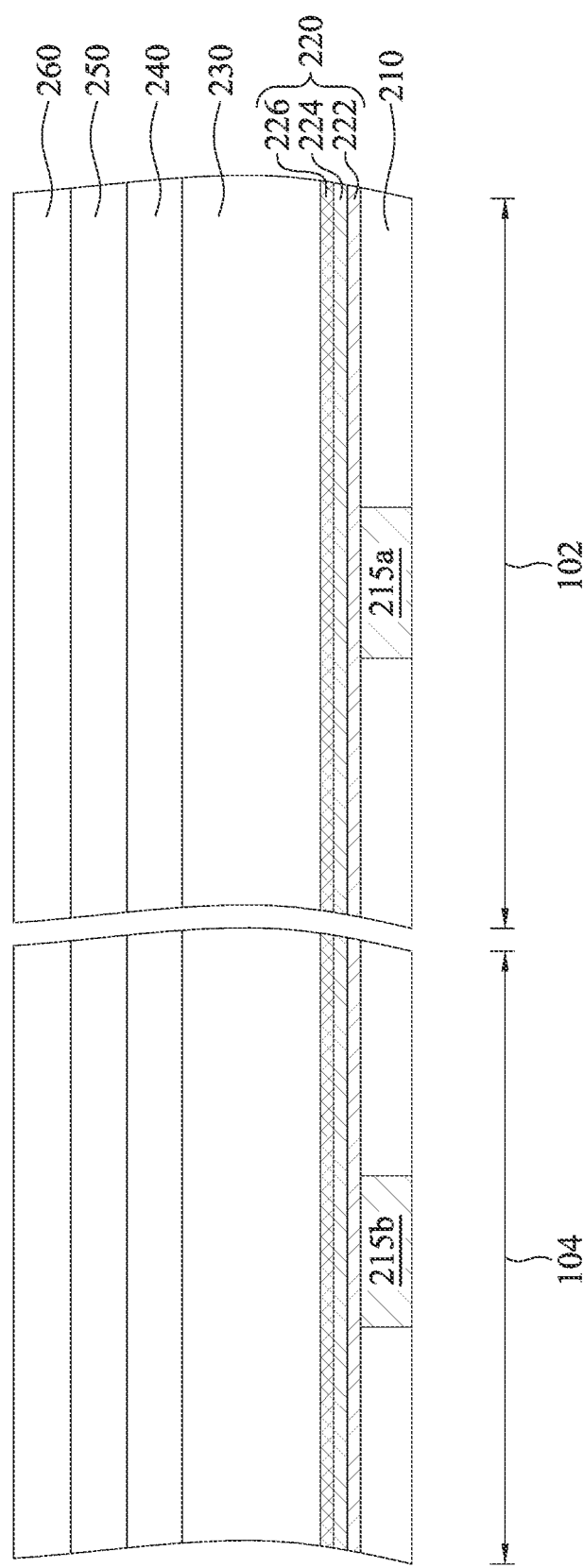

Reference is made to FIGS. 1 and 3. In operation S104 of the method M10, an etch stop layer is formed above the semiconductor device. For the sake of simplicity, only a portion of semiconductor device 100 (e.g., the first IMD layer 210 and the conductive lines 215a and 215b) is shown in FIG. 3. An etch stop layer 220 is formed above the first IMD layers 210. In accordance with some embodiments of the present disclosure, the etch stop layer 220 includes two or more sub-layers formed of metal compounds, with each of the sub-layers alternatively referred to as an etch stop layer hereinafter. For example, the etch stop layer 220 includes a first sub-layer 222, a second sub-layer 224 over the first sub-layer 222, and a third sub-layer 226 over the second sub-layer 224.

The first sub-layer 222 includes a metal nitride. The metal in the first sub-layer 222 may include Al, Cu, Mn, or combinations thereof. Accordingly, the first sub-layer 222 may include aluminum nitride, copper nitride, manganese nitride, or combinations thereof. The atomic percentages of the metal and nitrogen in the first sub-layer 222 may be between about 20 percent and about 80 percent in accordance with some exemplary embodiments. For example, the first sub-layer 222 may include $Al_2N_3$ in accordance with some exemplary embodiments. The second sub-layer 224 includes a carbide, e.g., silicon carbide or oxygen-doped silicon carbide (SiOC). The third sub-layer 226 includes a metal oxide. The metal in the third sub-layer 226 may include Al, Cu, Mn, or combinations thereof. Accordingly, the third sub-layer 226 may include aluminum oxide, copper oxide, manganese oxide, or combinations thereof. The atomic percentages of the metal and oxygen in the third sub-layer 226 may be between about 20 percent and about 80 percent in accordance with some exemplary embodiments. For example, the third sub-layer 226 may include $Al_2O_3$ in accordance with some exemplary embodiments. The formation methods for forming each of the first sub-layer 222, the second sub-layer 224, and the third sub-layer 226 include, and are not limited to, CVD and ALD. The bottom surface of the first sub-layer 222 may be in contact with the first IMD layer 210. In some embodiments, the first sub-layer 222 is AlN, the second sub-layer 224 is SiOC, and the third sub-layer 226 is AlO.

Reference is made to FIGS. 1 and 3. In operation S106 of the method M10, an IMD layer is deposited above the etch stop layer. As shown in FIG. 3, a second IMD layer 230 is deposited on the etch stop layer 220. In some embodiments, the second IMD layer 230 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the third sub-layer 226 of the etch stop layer 220. When selected from the same candidate materials, the materials of second IMD layer 230 and the first IMD layer 210 may be the same or different from each other. In some embodiments, the thickness of the second IMD layer 230 is in a range of about 700 angstroms to about 800 angstroms. In some other embodiments, the second IMD layer 230 has another thickness suitable for critical dimension of the features to be patterned in the second IMD layer 230.

Reference is made to FIGS. 1 and 3. In operation S108 of the method M10, hard mask layers are deposited above the IMD layer. For example, in FIG. 3, a first hard mask layer 240 is deposited on the second IMD layer 230. In subsequent processing operation, a pattern is formed on the first hard mask layer 240 using patterning techniques described herein. The patterned first hard mask layer 240 is then used as an etching mask for patterning the second IMD layer 230. In some embodiments, a material composition of the first hard mask layer 240 may be selected to provide a high etch selectivity with respect to mask layers subsequently formed over the first hard mask layer 240. The first hard mask layer 240 may include more than one layer and include more than one material.

The first hard mask layer 240 may be formed of a material that includes an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or combinations thereof. In some embodiments, when the second IMD layer 230 includes a low-k material, the first hard mask layer 240 may be formed from an oxide material, such as silicon oxide.

The first hard mask layer 240 may be formed using a process such as CVD, ALD, or the like. In some embodiments, the first hard mask layer 240 has a thickness between about 200 angstroms and about 400 angstroms. In some other embodiments, the first hard mask layer 240 have another thickness suitable for critical dimension of the features to be patterned in the second IMD layer 230 and the first hard mask layer 240.

A second hard mask layer 250 is deposited on the first hard mask layer 240. In subsequent processing operation, a pattern is formed on the second hard mask layer 250 using patterning techniques described herein. The patterned second hard mask layer 250 is then used as an etching mask for patterning the first hard mask layer 240. In some embodiments, a material composition of the second hard mask layer 250 may be selected to provide a high etch selectivity with respect to mask layers subsequently formed over the second hard mask layer 250. The second hard mask layer 250 may include more than one layer and include more than one material.

As discussed below, the second hard mask layer 250 is used as an etching mask for etching the first hard mask layer 240 and transferring the pattern of the second hard mask layer 250 to the first hard mask layer 240. The second hard mask layer 250 may be formed from a material different from the first hard mask layer 240. Alternatively, the first hard mask layer 240 may include more than one layer and include more than one material and may include a material different from the second hard mask layer 250. In some embodiments, when the first hard mask layer 240 includes an oxide material, the second hard mask layer 250 may be formed from titanium nitride, tungsten, silicon, titanium oxide, or a metal oxide.

The second hard mask layer 250 may be formed by a process such as CVD, ALD, or the like. Other processes and materials may be used to form the second hard mask layer 250. In some embodiments, the second hard mask layer 250 has a thickness between about 200 angstroms and about 400 angstroms. In some other embodiments, the second hard mask layer 250 may have another thickness suitable for critical dimension of the features to be patterned in the second IMD layer 230, in the first hard mask layer 240, or in the second hard mask layer 250.

A third hard mask layer 260 is deposited on the second hard mask layer 250. In subsequent processing operation, a pattern is formed on the third hard mask layer 260 using patterning techniques described herein. The patterned third hard mask layer 260 is then used as an etching mask for patterning the second hard mask layer 250. The third hard mask layer 260 may include more than one layer and include more than one material.

The third hard mask layer 260 may be formed from a material including an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or combinations thereof. The third hard mask layer 260 may include more than one layer and include more than one material, and may include a material different from the second hard mask layer 250. In some embodiments, when the second hard mask layer 250 includes titanium nitride, tungsten, silicon, titanium oxide, or a metal oxide, the third hard mask layer 260 may be formed from an oxide material, such as silicon oxide. In some embodiments, the first hard mask layer 240 and the third hard mask layer 260 are silicon oxide, and the second hard mask layer is titanium nitride.

The third hard mask layer 260 may be formed using a process such as CVD, ALD, or the like. In some embodiments, a material composition of the third hard mask layer 260 may be determined to provide a high etch selectivity with respect to other layers such as the first hard mask layer 240, the second hard mask layer 250, or other layers.

Figure 4:
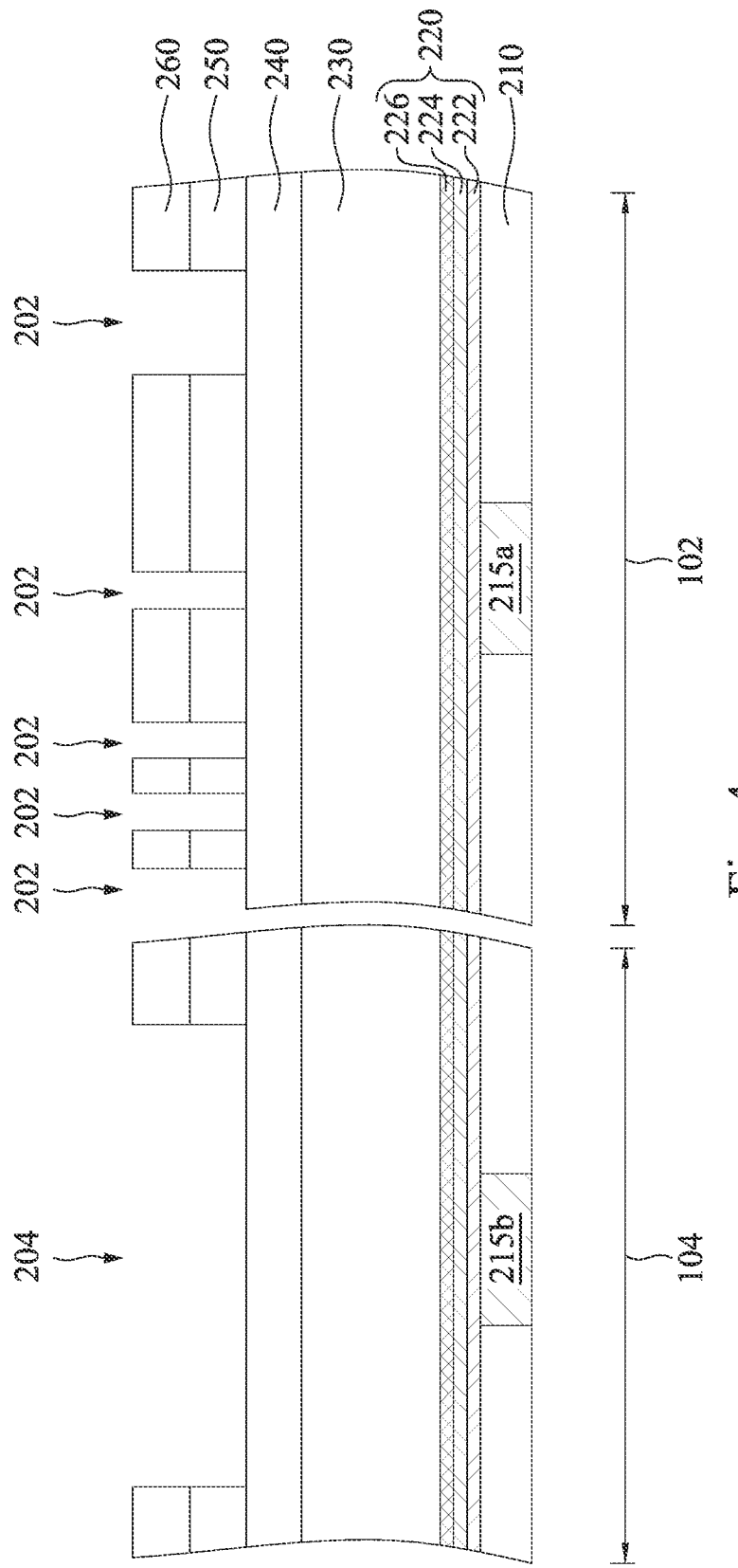

Reference is made to FIGS. 1 and 4. In operation S110 of the method M10, the hard mask layers are patterned to form trenches and/or openings therein. As shown in FIG. 4, the third hard mask layer 260 and the second hard mask layer 250 are patterned to form trenches 202 over the device region 102. Optionally, at least one opening 204 is formed in the third hard mask layer 260 and the second hard mask layer 250 and over the peripheral region 104. As such, the first hard mask layer 240 is exposed by the trenches 202 and/or the opening 204.

Figure 5:
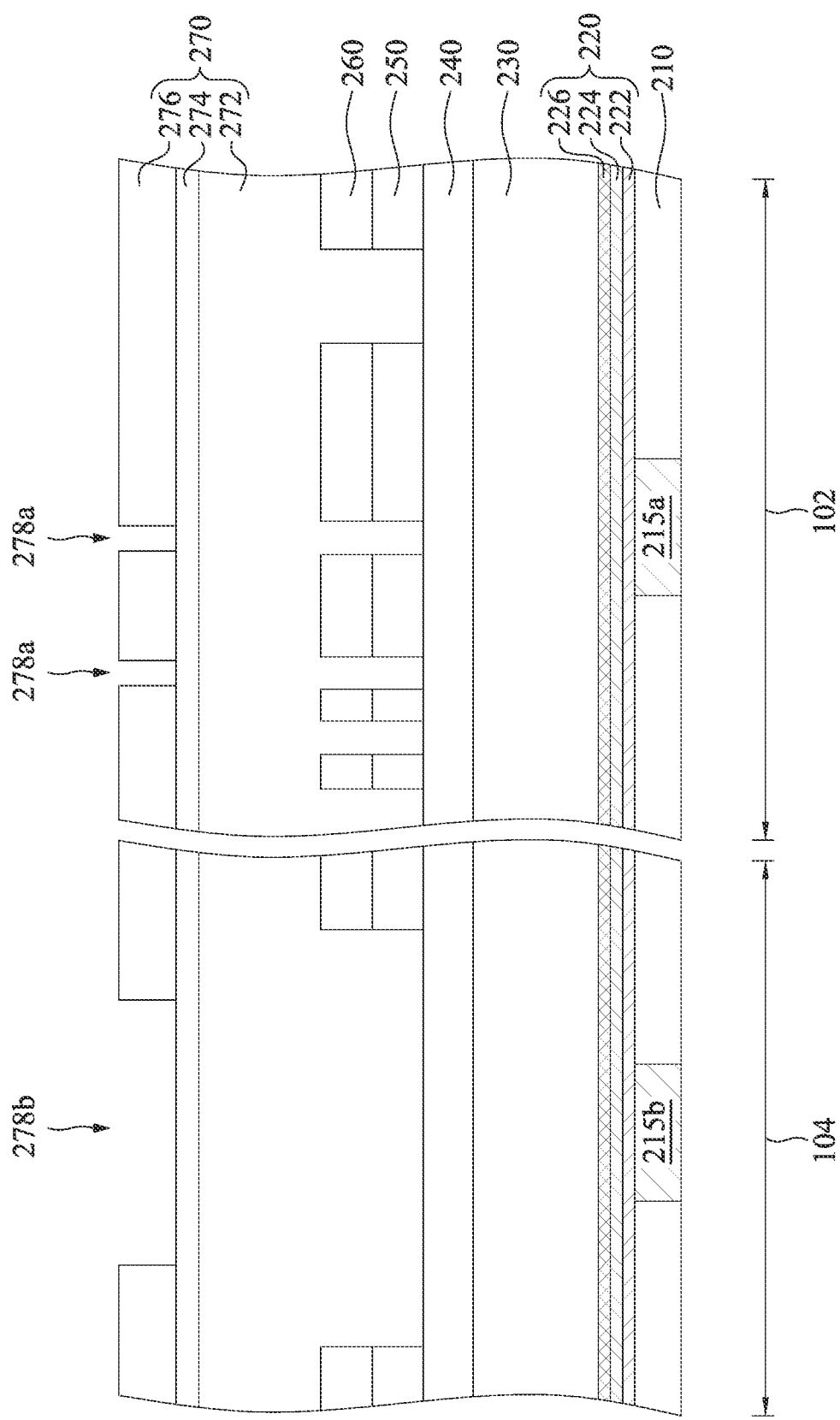

Reference is made to FIGS. 1 and 5. In operation S112 of the method M10, an etching mask is formed. As shown in FIG. 5, an etching mask 270, which may be a tri-layer, is formed. The etching mask 270 may include a bottom layer (also sometimes referred to as an under layer) 272, a middle layer 274 over the bottom layer 272, and a top layer (also sometimes referred to as an upper layer) 276 over the middle layer 274. In some embodiments, the bottom layer 272 and the top layer 276 are formed of photo resists, with the bottom layer 272 being cross-linked already. The middle layer 274 may be formed of an inorganic material, which may be a nitride (such as silicon nitride), an oxynitride (such as silicon oxynitride), an oxide (such as silicon oxide), or the like. The middle layer 274 has a high etching selectivity with relative to the top layer 276 and the bottom layer 272, and hence the top layer 276 may be used as an etching mask for patterning the middle layer 274, and the middle layer 274 may be used as an etching mask for patterning the bottom layer 272. The top layer 276 is patterned to form openings 278a and 278b, which are used to define via openings in the second IMD layer 230. The openings 278a are formed over the device region 102, and the opening 278b is formed over the peripheral region 104. The lithography process in the patterning may be performed using an EUV light, for example, with 193 nm wavelength.

Figure 6:
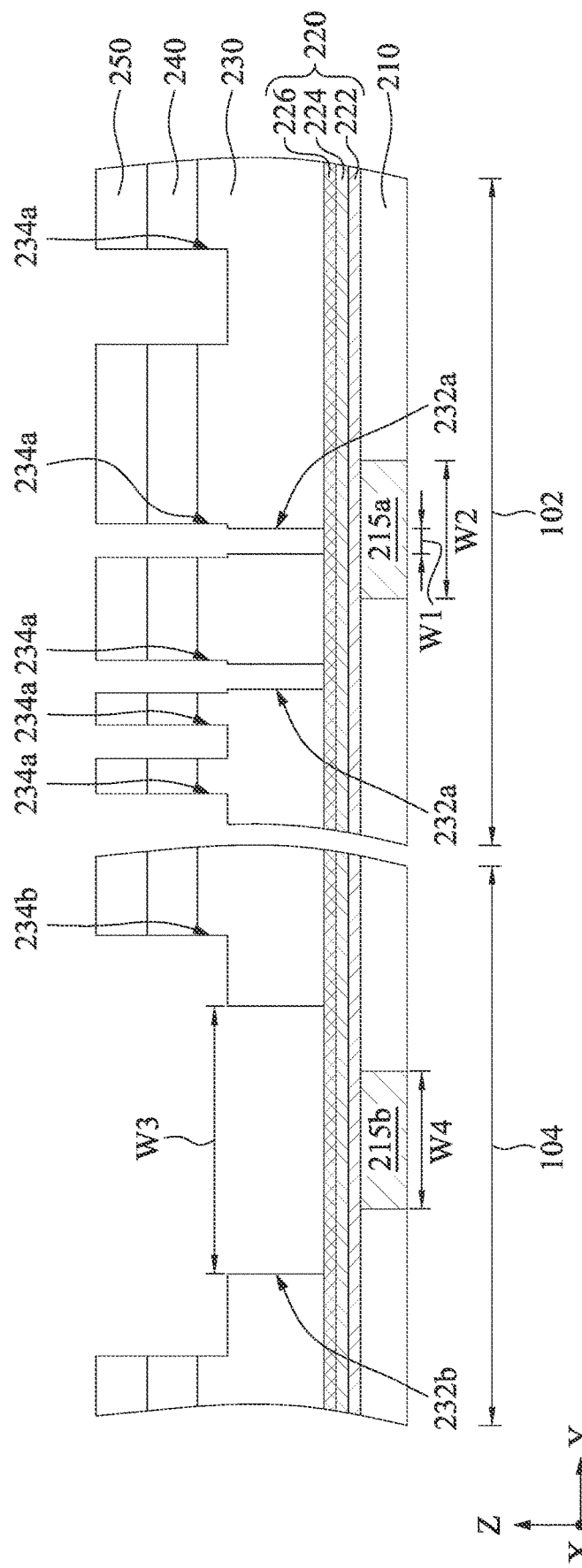

Reference is made to FIGS. 1 and 6. In operation S114 of the method M10, device via openings, testing via opening, trenches, and recess are formed in the IMD layer. Specifically, the middle layer 274 (see FIG. 5), the bottom layer 272 (see FIG. 5), the first hard mask layer 240, and the second IMD layer 230 are sequentially etched. The etching of layers stops in the second IMD layer 230 and form via openings in the second IMD layer 230. During this etching process, the via openings have a depth shallower than the thickness of the second IMD layer 230, such that the via openings do not expose the etch stop layer 220.

After the etching process, the remaining etching mask 270 (see FIG. 5) is removed to expose the third hard mask layer 260 (see FIG. 5), and the third hard mask layer 260 is then etched to expose the second hard mask layer 250. The first hard mask layer 240 and the second IMD layer 230 are then etched until the via openings reaches the top surface of the etch stop layer 220. As shown in FIG. 6, the etching processes form device via openings 232a, at least one testing via opening 232b, trenches 234a, and at least one recess 234b. The device via openings 232a and the trenches 234a are formed over the device region 102, and the testing via opening 232b and the recess 234b are formed over the peripheral region 104. At least one of the device via openings 232a is directly over the conductive line 215a, and the testing via opening 232b is directly over the conductive line 215b. The trenches 234a are shallower than the device via openings 232a, and the recess 234b is shallower than the testing via opening 232b.

As shown in FIG. 6, the conductive lines 215a and 215b extend in a first direction (e.g., the X direction), and a width (or size or diameter) W1 of the device via opening 232a in a second direction (e.g., the Y direction) is smaller than a width W2 of the conductive line 215a in the second direction, and a width W3 of the testing via opening 232b in the second direction is larger than a width W4 of the conductive line 215b in the second direction. The width W2 of the conductive line 215a may be substantially the same as the width W4 of the conductive line 215b. While the device via openings 232a are configured to accommodate conductive vias 292a (see FIG. 11) for interconnecting conductive lines 294a (see FIG. 11) and the conductive line 215a, the testing via opening 232b is a testing pattern for overlay measurement. For example, an overlay between the testing via opening 232b and the conductive line 215b can be obtained, and the overlay between the via openings 215a and the conductive lines 215a can be estimated from the overlay between the testing via opening 232b and the conductive line 215b. According to some embodiments, the device via openings 232a are used for overlay measurement.

Figure 7:
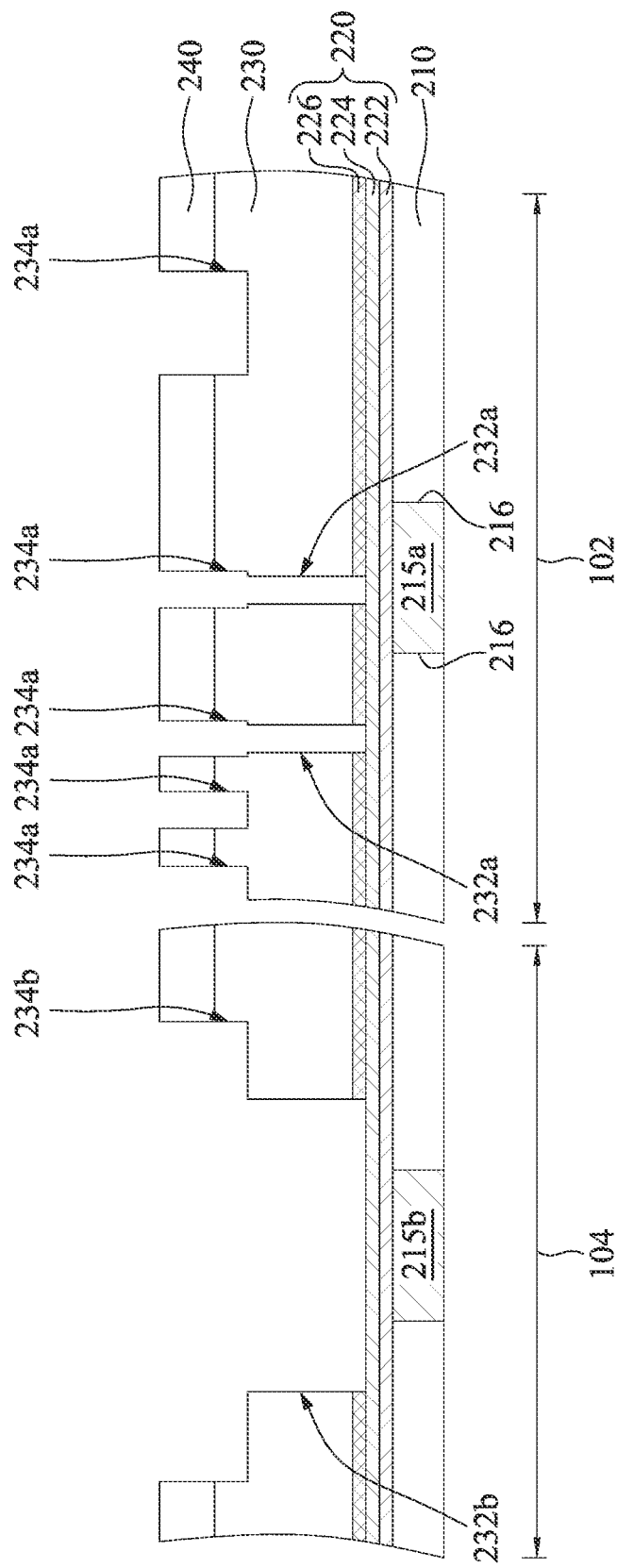

Reference is made to FIGS. 1 and 7. In operation S116 of the method M10, the third sub-layer of the etch stop layer is etched to deepen the device via openings and the testing via opening. As shown in FIGS. 6 and 7, the second hard mask layer 250 is etched to expose the first hard mask layer 240. The third sub-layer 226 of the etch stop layer 220 is then patterned such that the device via openings 232a and the testing via opening 232b are extended into the third sub-layer 226. Further, the device via openings 232a and the testing via opening 232b expose the second sub-layer 224 of the etch stop layer 220, but the device via openings 232a do not expose both opposite sidewalls 216 of the conductive line 215a.

Reference is made to FIG. 1. In operation S118 of the method M10, an overlay measurement is performed to obtain an overlay between the device via openings and the conductive line. As shown in FIG. 7, during this process, since the edges of the conductive line 215a is covered by the layers formed thereon, a see-through measurement, such as a backscattered electron detecting process, can be applied to obtain the overlay between the device via openings 232a and the conductive line 215a.

Figure 12:
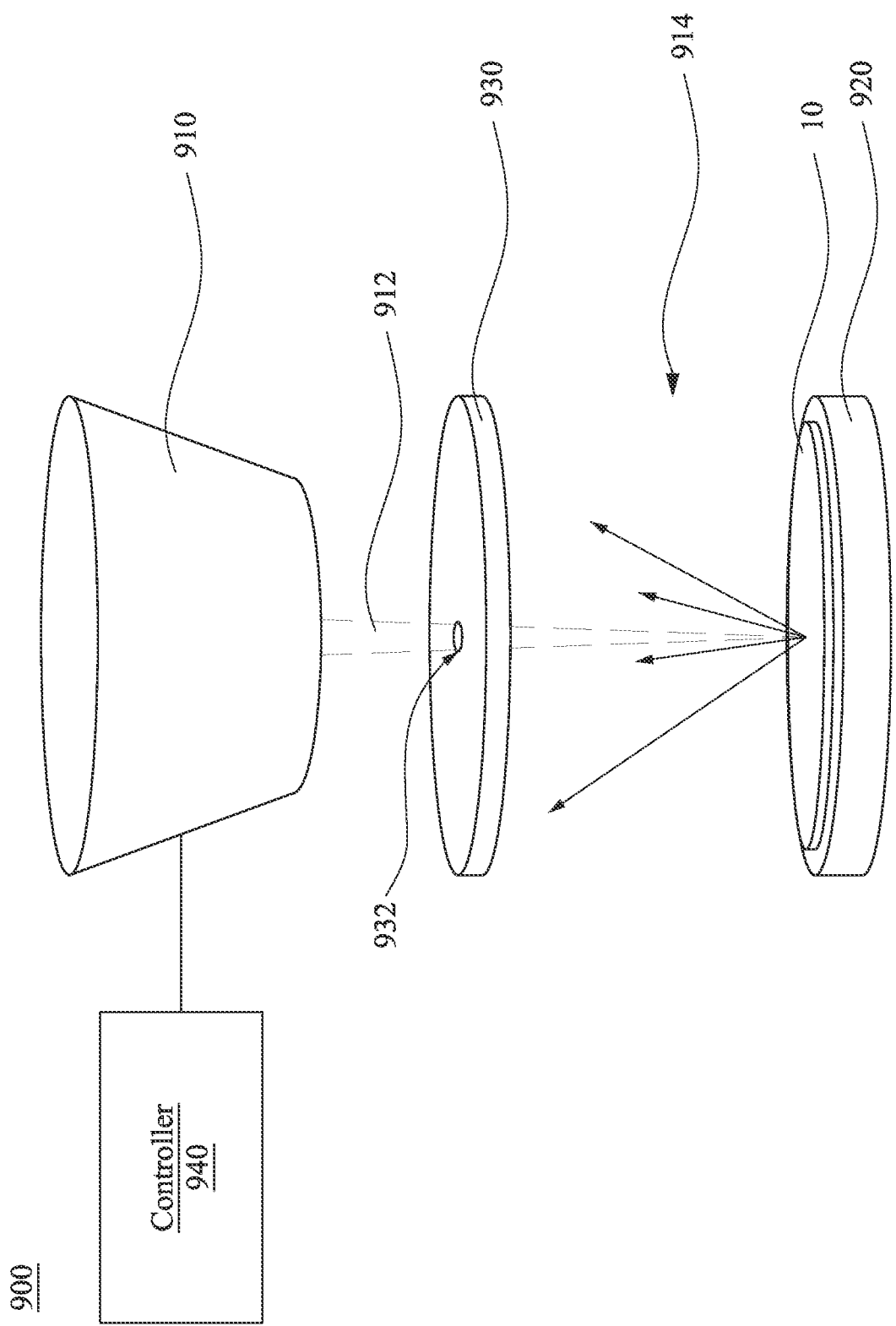
FIG. 12 is a schematic diagram of a measurement apparatus for implementing one or more embodiments of the present disclosure.

FIG. 12 is a schematic diagram of a measurement apparatus 900 for implementing one or more embodiments of the present disclosure. The measurement apparatus 900 includes an electron source 910, a wafer stage 920, and a backscattered electron detector 930. A wafer 10 (e.g., a wafer including the structure shown in FIG. 7) may be disposed on the wafer stage 920. The electron source 910 provides electrons (i.e., the electron beam 912) emitted from a conducting material by heating conducting materials to a very high temperature, where the electrons have sufficient energy to overcome the work function barrier and escape from the conducting material (thermionic sources), or by applying an electric field sufficiently strong that the electron tunnel through the barrier (field emission sources). The backscattered electron detector 930 is disposed between the electron source 910 and the wafer stage 920 and has an opening 932 at its center. The electron beam 910 is ejected from the electron source 910, passes through the opening 932, and is incident on the wafer 10. Backscattered electrons 914 are reflected from the wafer 10 and scatter to the backscattered electron detector 930.

The backscattered electron detector 930 is sensitive to electrons with high energy such that the backscattered electron detector 930 detects elastically scattered electrons. These electrons are higher in energy from atoms below the sample surface. Backscattered electrons 914 vary in their amount and direction due to the composition and topography of the specimen. The contrast of the backscattered electron image depends on multiple factors, including the atomic number (Z) of the sample material, the acceleration voltage of the primary beam and the specimen angle (tilt) with relation to the primary beam. Materials with elements composed of a higher atomic number (Z) yield more backscattered electrons than lower Z elements.

Figure 13B:
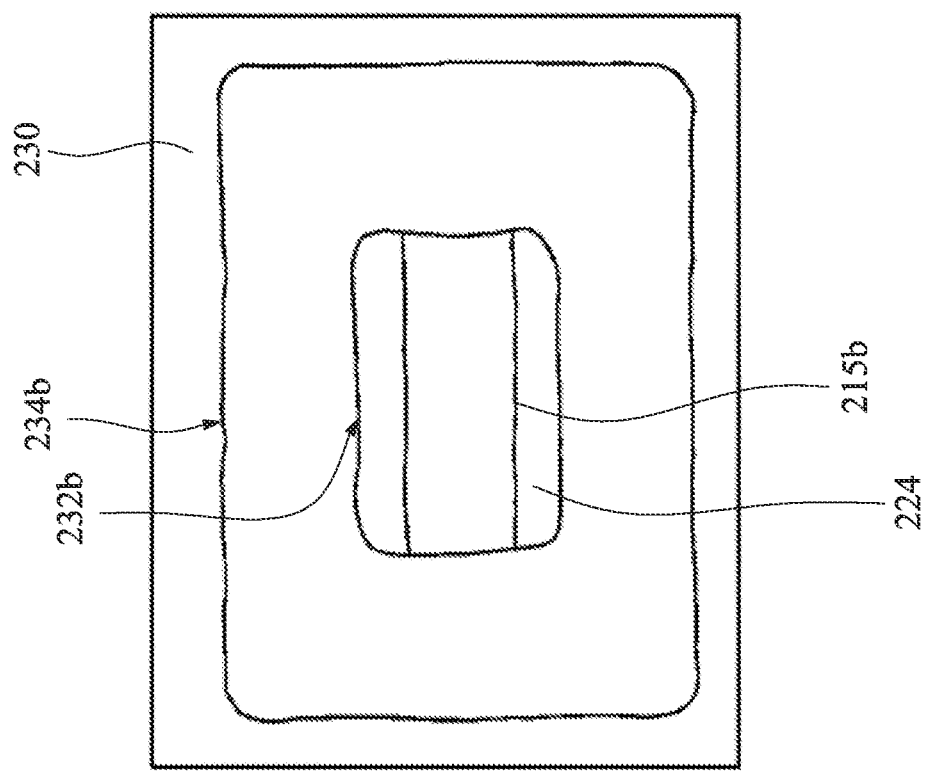
FIG. 13B is a schematic diagram of a backscattered electron image detected from the backscattered electron detector according to some embodiments.
Figure 13A:
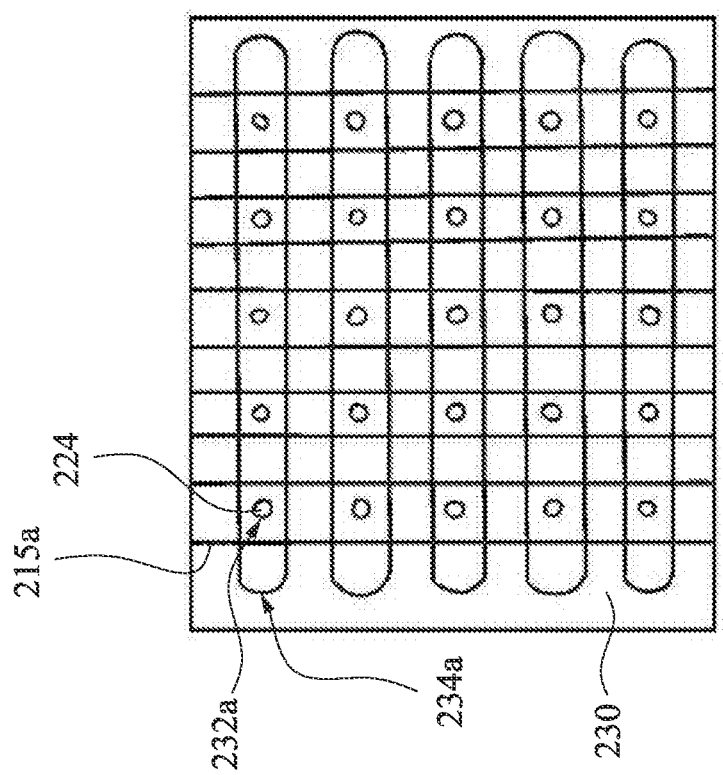
FIG. 13A is a schematic diagram of a backscattered electron image detected from the backscattered electron detector according to some embodiments.

FIG. 13A is a schematic diagram of a backscattered electron image detected from the backscattered electron detector 930 according to some embodiments. The backscattered electron image shows spatial distributions of atomic weights of elements (e.g., the conductive lines 215a, 215b, the etch stop layer 220, and the second IMD layer 230) of the integrated circuit structure. As mentioned above, the contrast of the image of the backscattered electron detector 930 depends on the materials of the sample. In some embodiments, the conductive line 215a includes copper, and the second sub-layer 224 includes silicon, oxygen, and carbon (e.g., SiOC). The material difference therebetween makes a clear contrast in the image, such that edges of the conductive line 215a are sharped and are clear shown in the image.

The measurement apparatus 900 further includes a controller 940 for controlling a voltage of the electron beam 912. For the overlay measurement, a voltage of the electron beam 912 is in a range of about 3 kV to about 9 kV. If the voltage is higher than about 9 kV, the electron beam 912 may damage the second IMD layer 230; if the voltage is lower than about 3 kV, the image, especially at the edges of the conductive lines 215a, may be unclear.

The controller 940 is further configured for controlling a current of the electron beam 912. For the overlay measurement, a current of the electron beam 912 is in a range of about 340 pA to about 360 pA. If the current is higher than about 360 pA, the resolution of the image may be low; if the current is lower than about 340 pA, the electron beam 912 may be easily induce charging due to more frame.

The image of the backscattered electrons is then analyzed. If the device via opening is aligned with the conductive line, the method M10 proceeds to the operation S120 (see FIG. 1). Otherwise, an overlay correction process is performed prior to the next lithography process for other wafers.

Figure 8:
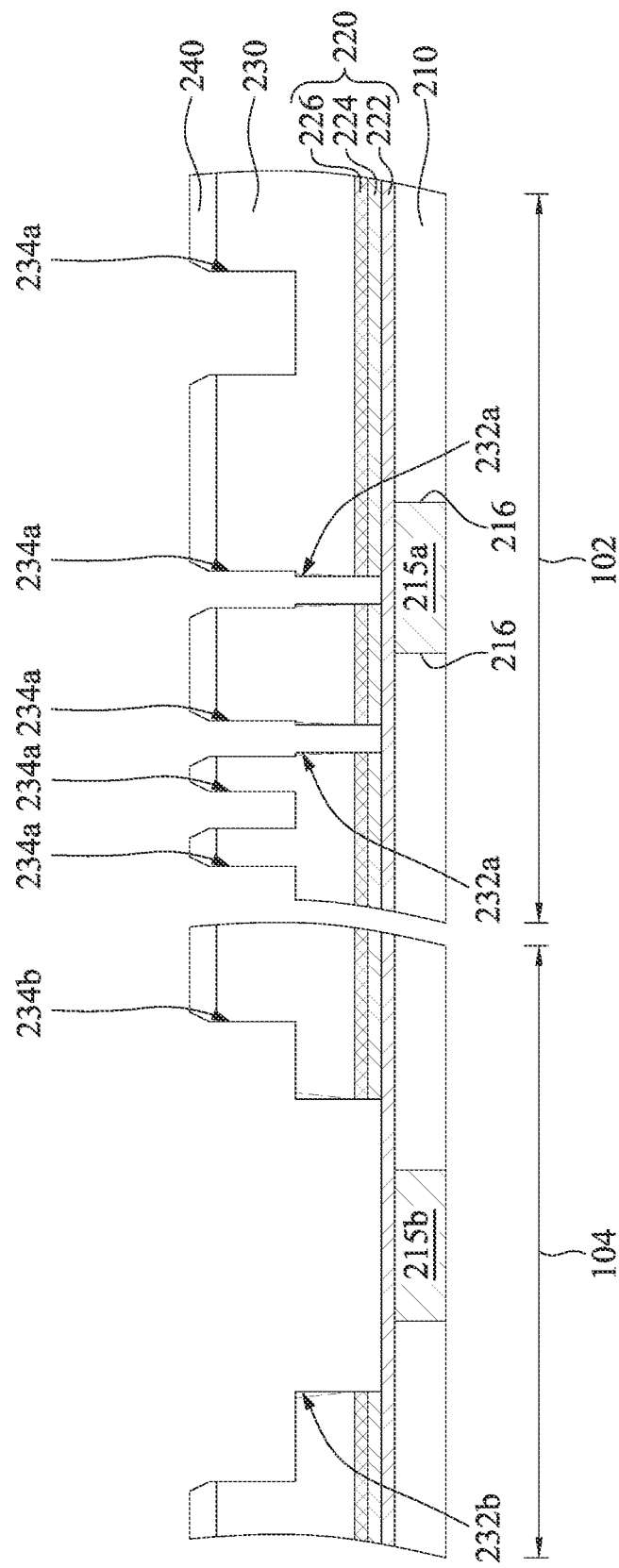

Reference is made to FIGS. 1 and 8. In operation S120 of the method M10, the second sub-layer of the etch stop layer is etched to further deepen the device via openings and the testing via opening. As shown in FIG. 8, the second sub-layer 224 of the etch stop layer 220 is patterned such that the device via openings 232a and the testing via opening 232b are extended into the second sub-layer 224 and expose the first sub-layer 222 of the etch stop layer 220, but the device via openings 232a do not expose both opposite sidewalls 216 of the conductive line 215a since the device via openings 232a are narrower than the width W2 (see FIG. 6) of the conductive line 215a. In some embodiments, portions of the first hard mask layer 240 are removed during the patterning process such that a thickness of the first hard mask 240 is reduced and the top surfaces of the first hard mask layer 240 are rounded. The trenches 234a and the recess 234b are also deepened. In some embodiments, the sidewalls of the device via openings 232a and the testing via opening 232b become oblique (as shown in dashed lines in FIG. 8), and the device via openings 232a and the testing via opening 232b have tapered shapes in the cross-sectional view.

Figure 9:
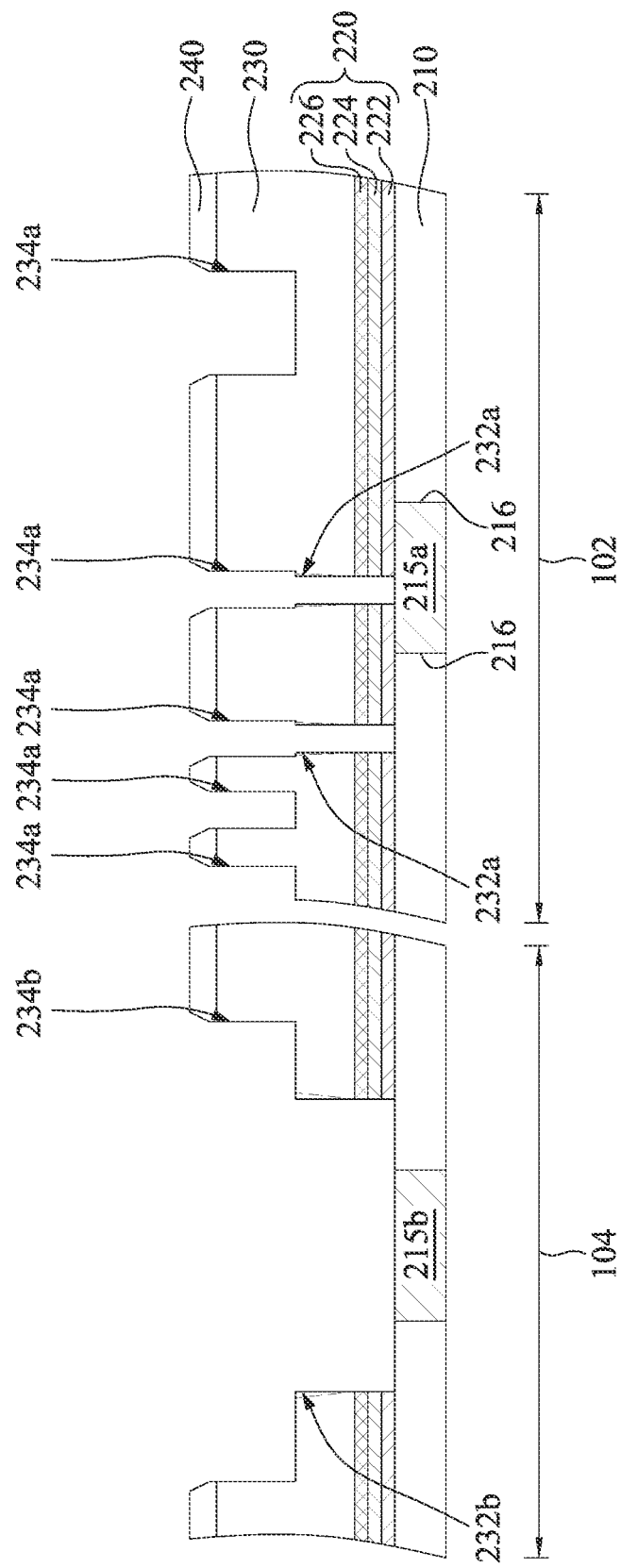

Reference is made to FIGS. 1 and 9. In operation S122 of the method M10, the first sub-layer of the etch stop layer is etched to further deepen the device via openings and the testing via opening. As shown in FIG. 9, the first sub-layer 222 of the etch stop layer 220 is patterned such that the device via openings 232a and the testing via opening 232b are extended into the first sub-layer 222, but the device via openings 232a do not expose both opposite sidewalls 216 of the conductive line 215a.

Figure 10:
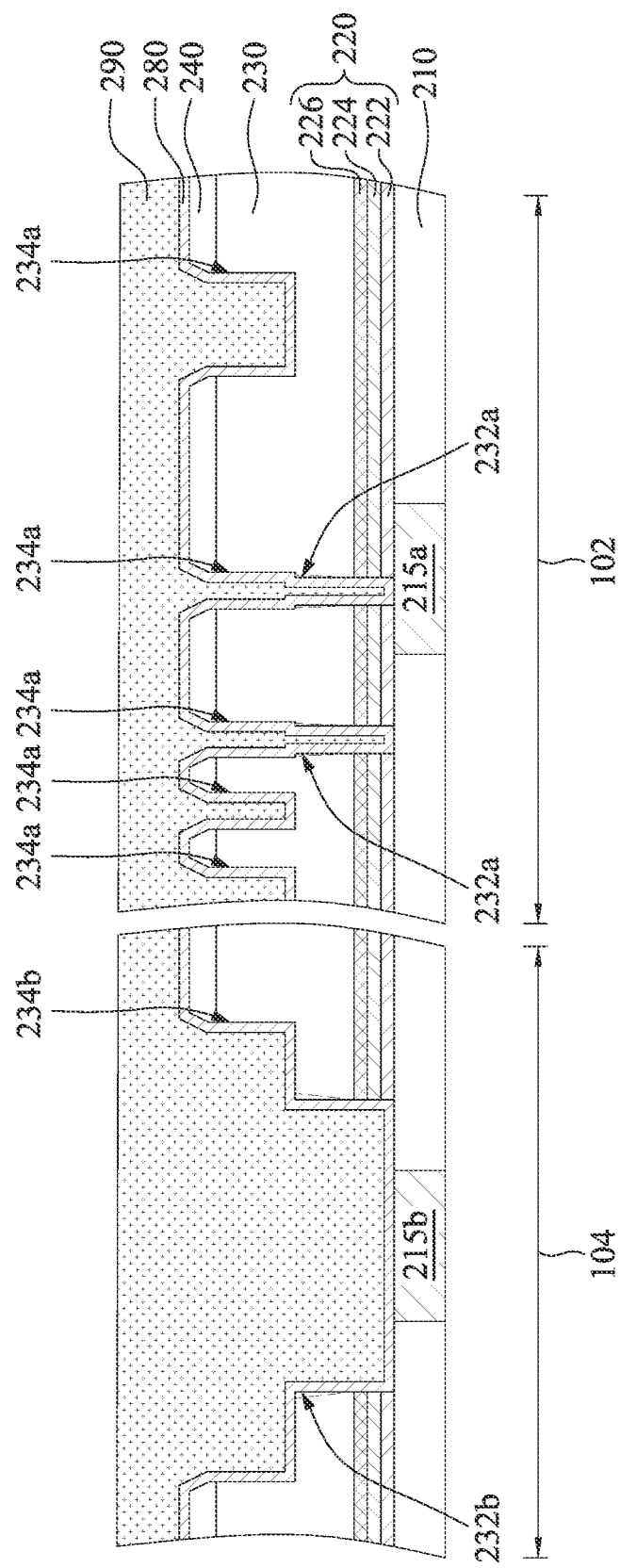

Reference is made to FIGS. 1 and 10. In operation S124 of the method M10, conductive features are formed in the device via openings, testing via opening, trenches, and recess of the IMD layer. Specifically, a barrier layer 280 is conformally formed in the device via openings 232a, the testing via opening 232b, the trenches 234a, and the recess 234b. In some embodiments, the barrier layer 280 is a metal layer including Ta, TaN, Co, Ru, Ti, TiN, or combinations thereof. The barrier layer 280 may be formed using methods such as physical vapor deposition (PVD), sputtering, chemical vapor deposition (CVD), atomic layer deposition (ALD), and the like.

A conductive material 290 is formed on the barrier layer 280 and fills in device via openings 232a, the testing via opening 232b, the trenches 234a, and the recess 234b. The conductive material 290 at least includes metal element, e.g., copper (Cu). The conductive material 290 may include other suitable materials such as Ru, W, Ti, Al, Co, or combinations thereof.

Figure 11:
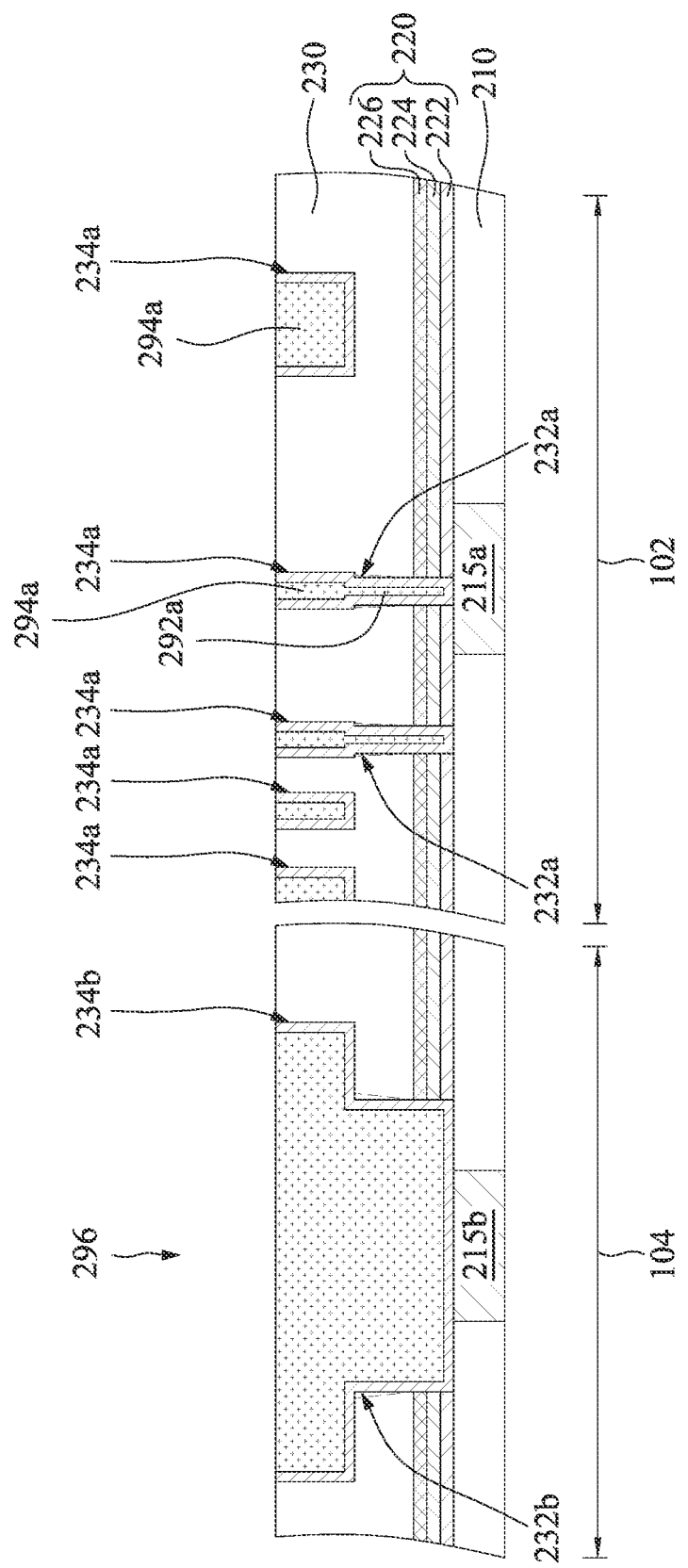

Reference is made to FIG. 11. A chemical mechanical polishing (CMP) process is performed after the formation of the conductive material 290 (see FIG. 10) to remove the excess portions of the conductive material 290 and the barrier layer 280 outside the trenches 234a and the recess 234b, thus exposing the top surface of the second IMD layer 230 and achieving a planarized surface. The portions of the conductive material 290 (and the barrier layer 280) in the trenches 234a are referred to as conductive lines 294a, the conductive material 290 (and the barrier layer 280) in the device via openings 232a are referred to as conductive vias 292a, and the portion of the conductive material 290 (and the barrier layer 280) in the recess 234b and the testing via opening 232b is referred to as a testing conductive pattern 296.

It is noted that since the overlay measurement of method M10 measures the overlay between the device via opening 232a and the conductive line 215a, such that the formation of the testing pattern 296 (including the formation of the recess 234a and the testing via opening 232b) can be omitted in method M10.

Figure 14:
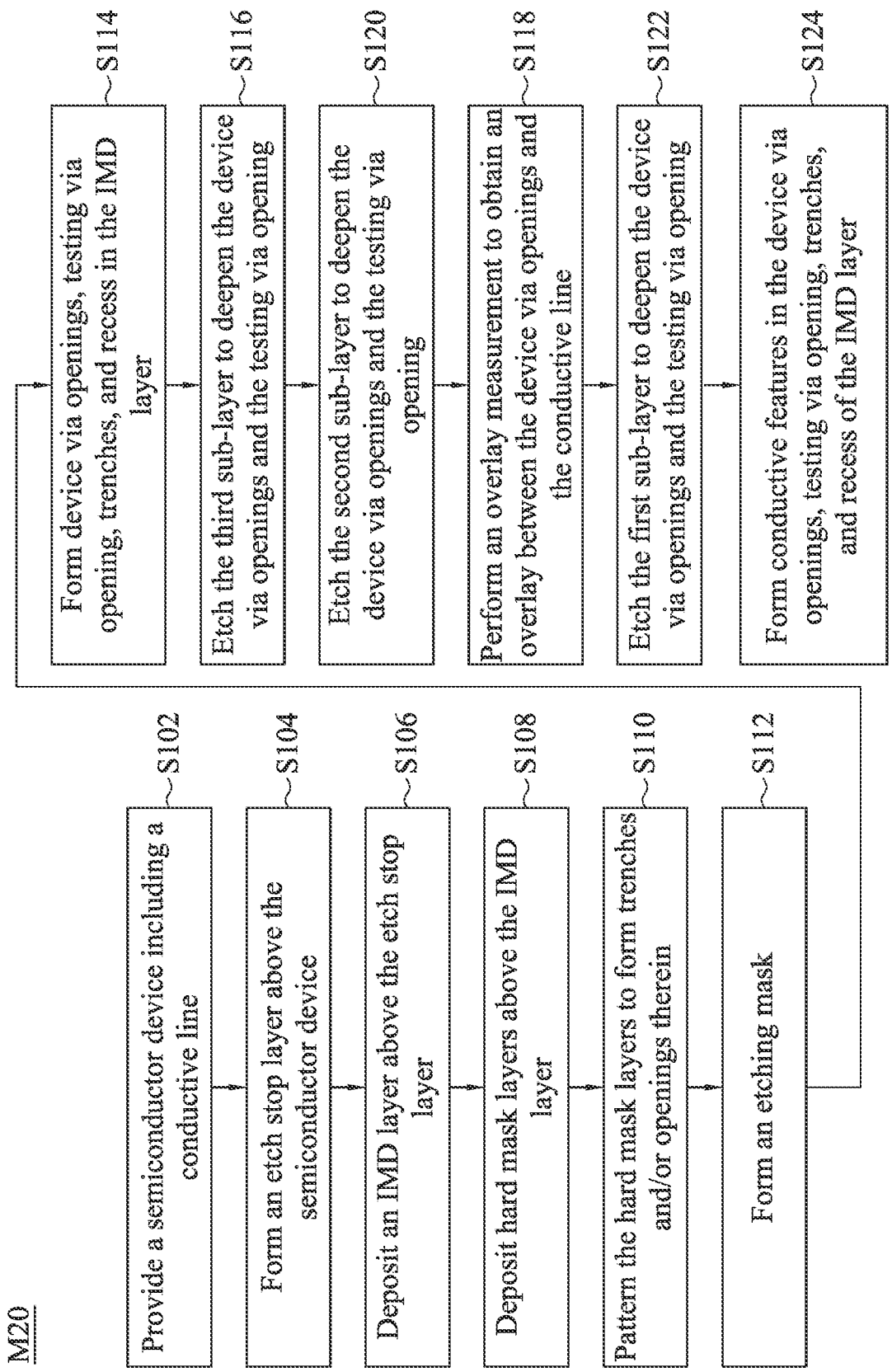
FIGS. 14-18 are flow charts of example methods for manufacturing integrated circuit structures according to some embodiments.

FIG. 14 is a flow chart of an example method M20 for manufacturing an integrated circuit structure according to some embodiments. The method M20 is similar to the method M10 of FIG. 1 except that the operation S118 of the method M20 is between the operations S120 and S122. In some embodiments, the conductive line 215a (see FIG. 8) includes copper, and the first sub-layer 224 (see FIG. 8) includes aluminum. The material difference therebetween makes a clear contrast in the image, such that edges of the conductive line 215a are clear shown in the image. Although the patterning process in the operation S120 may form oblique sidewalls at the device via openings 232a, the backscattered electron image still shows a clear contrast due to the material difference. Other relevant operation details of the method M20 are similar to or the same as the method M10, and, therefore, a description in this regard will not be repeated hereinafter.

Figure 15:
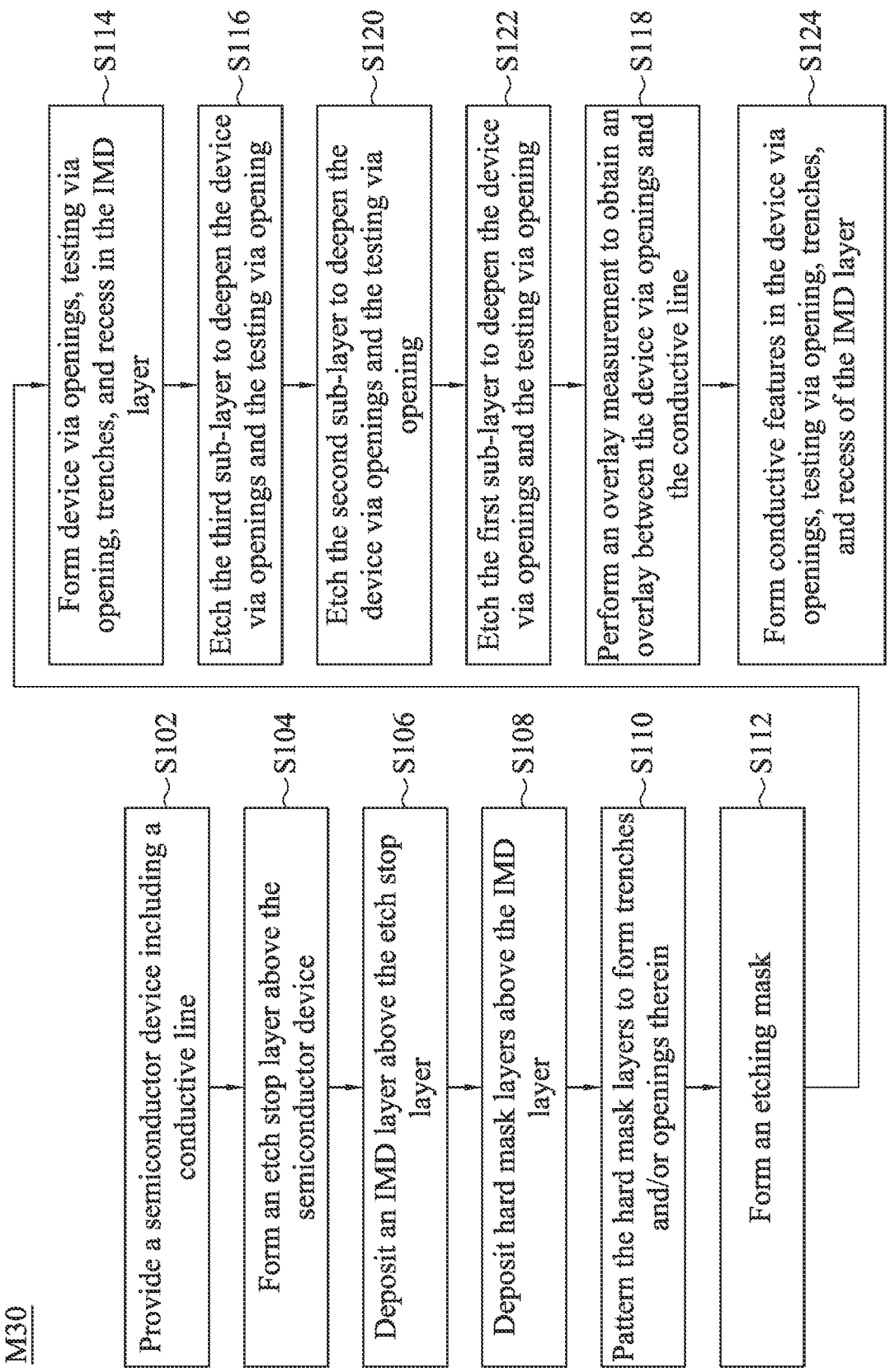

FIG. 15 is a flow chart of an example method M30 for manufacturing an integrated circuit structure according to some embodiments. The method M30 is similar to the method M10 of FIG. 1 except that the operation S118 of the method M30 is between the operations S122 and S124. In some embodiments, the conductive line 215a (see FIG. 9) includes copper, and the first sub-layer 224 (see FIG. 9) includes aluminum. The material difference therebetween makes a clear contrast in the image, such that edges of the conductive line 215a are clear shown in the image. Although the patterning process in the operation S120 may form oblique sidewalls at the device via openings 232a, the backscattered electron image still shows a clear contrast due to the material difference. Other relevant operation details of the method M30 are similar to or the same as the method M10, and, therefore, a description in this regard will not be repeated hereinafter.

Figure 16:
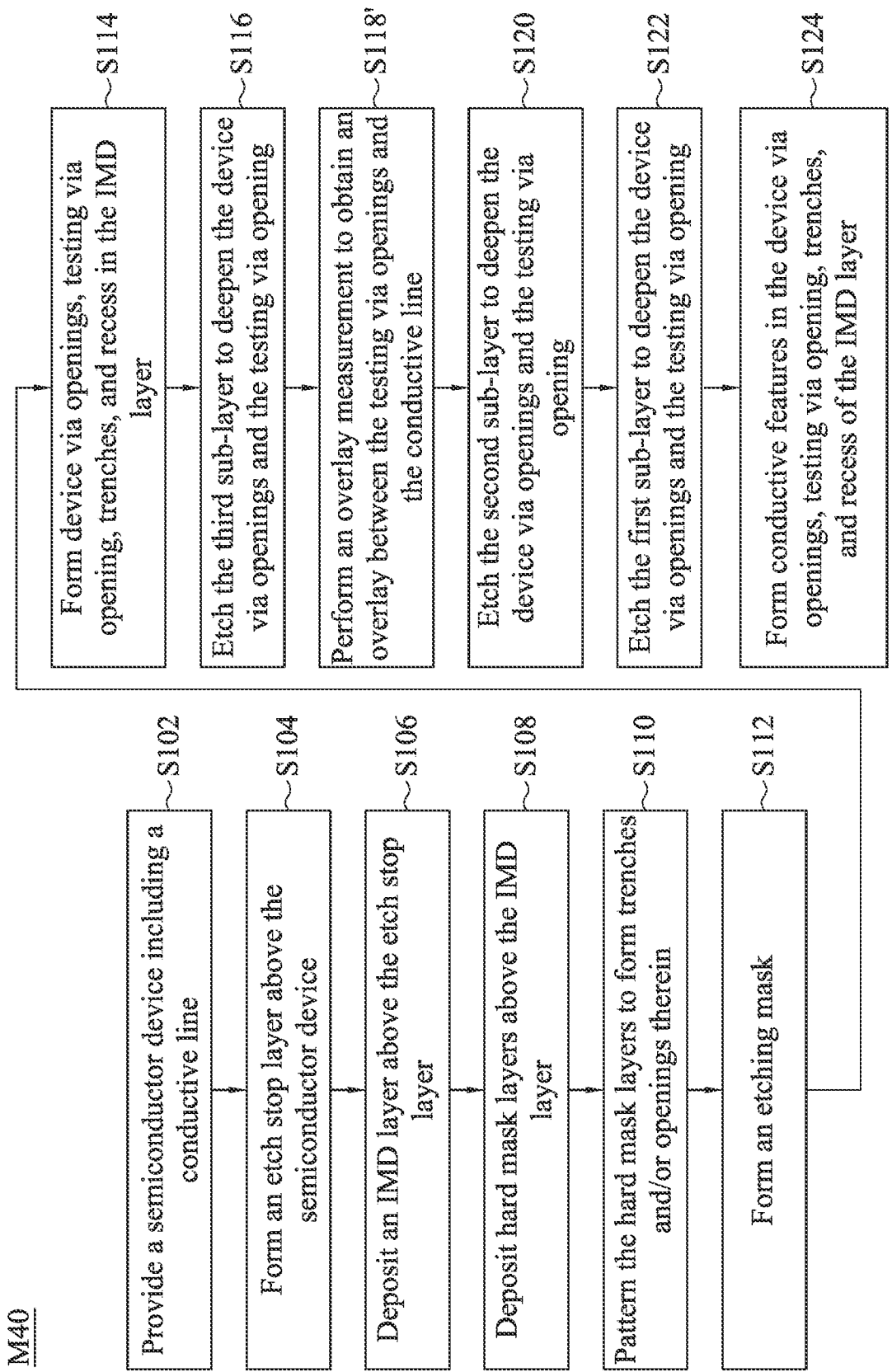

FIG. 16 is a flow chart of an example method M40 for manufacturing an integrated circuit structure according to some embodiments. The method M40 is similar to the method M10 of FIG. 1 except that the operation S118 of the method M10 is replaced with the operation S118'. In operation S118' of method M40, an overlay measurement is performed to obtain/determining an overlay between the testing via openings and the conductive line. The overlay measurement of operation S118' is similar to the operation S118 of method M10 of FIG. 1 except that the overlay measurement of operation S118' is performed on the testing via opening 232b (see FIG. 7).

FIG. 13B is a schematic diagram of a backscattered electron image detected from the backscattered electron detector 930 according to some embodiments. In some embodiments, the conductive line 215b includes copper, and the second sub-layer 224 includes silicon, oxygen, and carbon (e.g., SiOC). The material difference therebetween makes a clear contrast in the image, such that edges of the conductive line 215b are clear shown in the image. Other relevant operation details of the method M40 are similar to or the same as the method M10, and, therefore, a description in this regard will not be repeated hereinafter.

Figure 17:
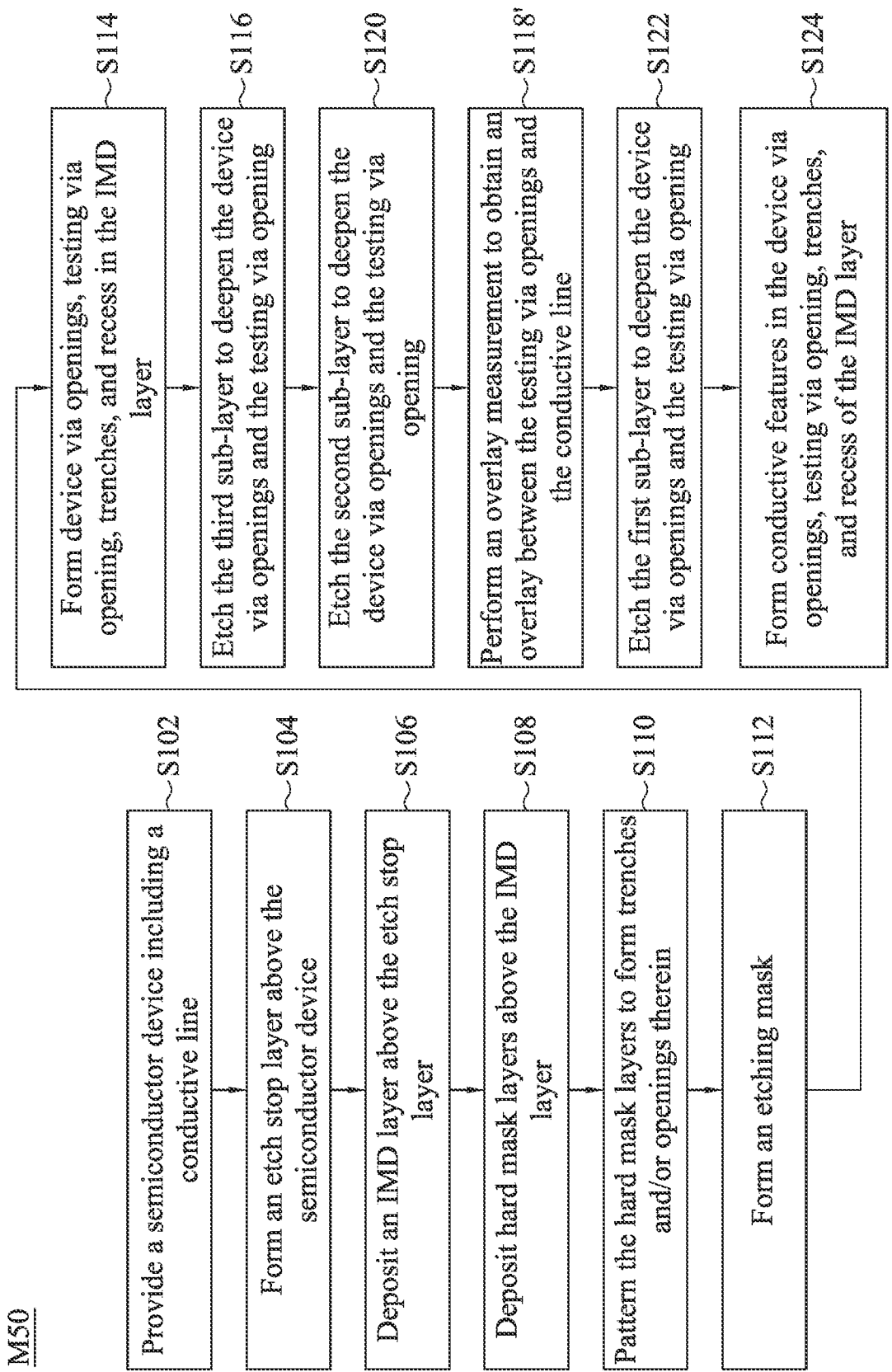

FIG. 17 is a flow chart of an example method M50 for manufacturing an integrated circuit structure according to some embodiments. The method M50 is similar to the method M40 of FIG. 16 except that the operation S118' of the method M50 is between the operations S120 and S122. In some embodiments, the conductive line 215b (see FIG. 8) includes copper, and the first sub-layer 224 (see FIG. 8) includes aluminum. The material difference therebetween makes a clear contrast in the image, such that edges of the conductive line 215b are clear shown in the image. Although the patterning process in the operation S120 may form oblique sidewalls at the device via openings 232a, the backscattered electron image still shows a clear contrast due to the material difference. Other relevant operation details of the method M50 are similar to or the same as the method M40, and, therefore, a description in this regard will not be repeated hereinafter.

Figure 18:
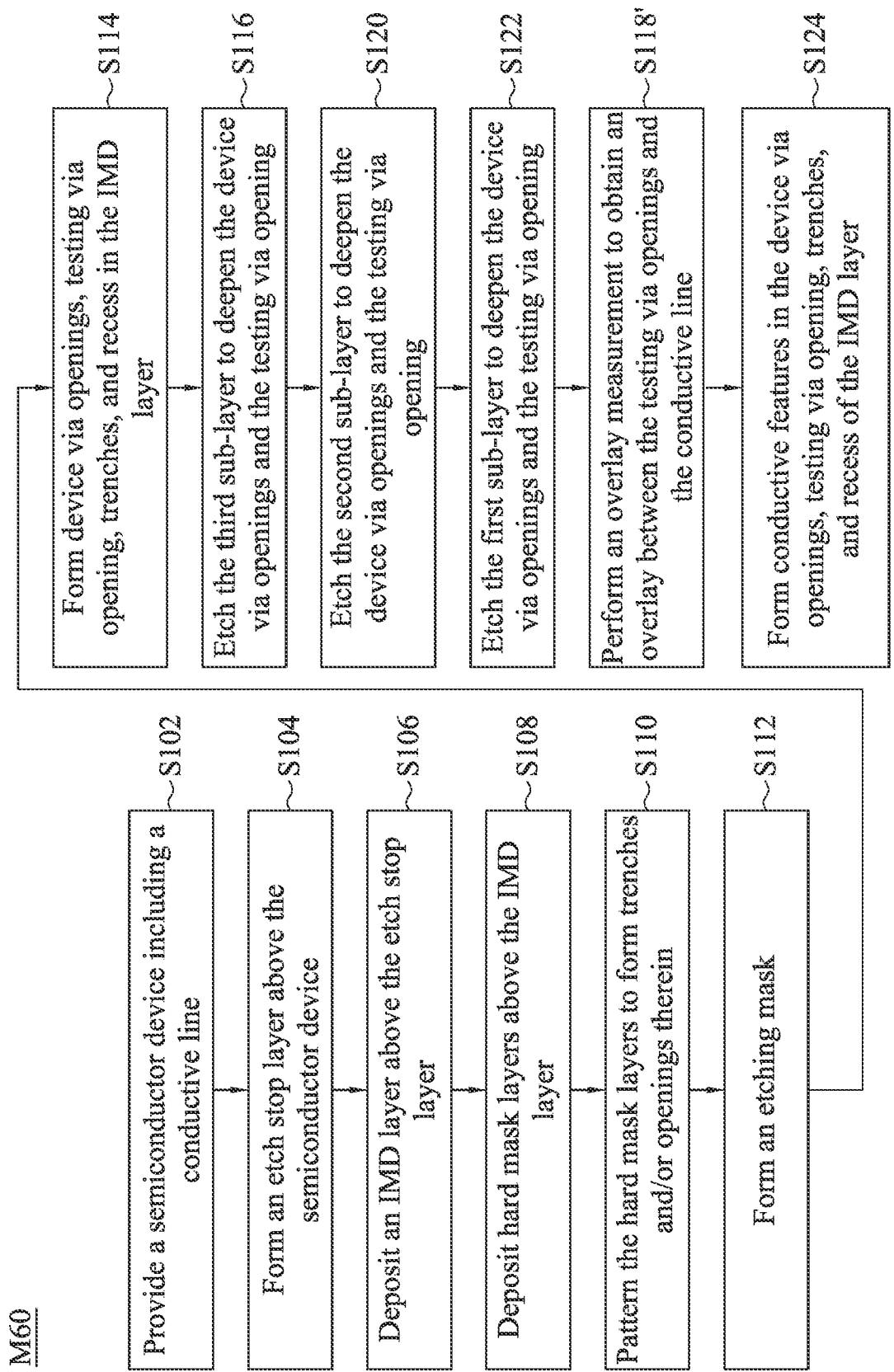

FIG. 18 is a flow chart of an example method M60 for manufacturing an integrated circuit structure according to some embodiments. The method M60 is similar to the method M40 of FIG. 16 except that the operation S118' of the method M50 is between the operations S122 and S124. In some embodiments, the conductive line 215b (see FIG. 8) includes copper, and the first sub-layer 224 (see FIG. 8) includes aluminum. The material difference therebetween makes a clear contrast in the image, such that edges of the conductive line 215b are clear shown in the image. Although the patterning process in the operation S120 may form oblique sidewalls at the device via openings 232a, the backscattered electron image still shows a clear contrast due to the material difference. Other relevant operation details of the method M60 are similar to or the same as the method M40, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the overlay measurements by using a backscattered electron detector provides clear images of the via opening and the underlying conductive lines (even the via opening has oblique sidewalls). Another advantage is that the overlay measurements can be performed even the etch stop layer is not etched through yet, such that some of the following manufacturing processes can be omitted when the overlay issues are found. In addition, the overlay measurement can be done by measuring the device via openings directly, thereby increasing reliability of the overlay results.

According to some embodiments, a method includes depositing an inter-metal dielectric (IMD) layer over a conductive line. A via opening is formed in the IMD layer and directly over the conductive line. A width of the conductive line is greater than a width of the via opening. An overlay measurement is performed. The overlay measurement includes obtaining a backscattered electron image of the via opening and the conductive line and determining an overlay between the via opening and the conductive line according to the backscattered electron image.

According to some embodiments, a method includes depositing an etch stop layer over a conductive line. An inter-metal dielectric (IMD) layer is deposited over the etch stop layer. An etching mask is deposited over the IMD layer. The etching mask is patterned. After the etching mask is patterned, the IMD layer is patterned by using the patterned etching mask to form a via opening in the IMD layer. The via opening exposes the etch stop layer. The etch stop layer is etched to deepen the via opening. The via opening in the etch stop layer does not expose both opposite sidewalls of the conductive line. After the etch stop layer is etched, an overlay measurement is performed to obtain a backscattered electron image of the via opening and the conductive line.

According to some embodiments, a method includes forming a conductive line over a peripheral region of a substrate, wherein the conductive line extends in a first direction. An etch stop layer is deposited over the substrate and covers the conductive line. An inter-metal dielectric (IMD) layer is deposited over the etch stop layer. An opening is formed in the IMD layer to expose a portion of the etch stop layer directly above the conductive line. A width of the opening in a second direction perpendicular to the first direction is larger than a width of the conductive line in the second direction. An overlay measurement is performed to obtain a spatial distribution of an atomic weight of the conductive line and a spatial distribution of an atomic weight of the etch stop layer. After the overlay measurement is performed, the etch stop layer is etched by using the IMD layer as an etch mask to expose the conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an etch stop layer over a conductive line, wherein the etch stop layer comprises:
   a first sub-layer over the conductive line;
   a second sub-layer over the first sub-layer; and
   a third sub-layer over the second sub-layer;
   depositing an inter-metal dielectric (IMD) layer over the etch stop layer;
   depositing an etching mask over the IMD layer;
   patterning the etching mask;
   after patterning the etching mask, patterning the IMD layer by using the patterned etching mask to form a via opening in the IMD layer, wherein the via opening exposes the etch stop layer;
   etching the etch stop layer to deepen the via opening, wherein the via opening in the etch stop layer does not expose both opposite sidewalls of the conductive line, and etching the etch stop layer comprises:
   etching the third sub-layer such that the via opening exposes the second sub-layer;
   etching the second sub-layer such that the via opening exposes the first sub-layer; and
   etching the first sub-layer such that the via opening exposes the conductive line; and
   after etching the third sub-layer of the etch stop layer and prior to etching the first sub-layer of the etch stop layer, performing an overlay measurement to obtain a backscattered electron image of the via opening and the conductive line.

2. The method of claim 1, wherein the overlay measurement is performed prior to etching the second sub-layer.

3. The method of claim 1, wherein the overlay measurement is performed after etching the second sub-layer.

4. The method of claim 1, further comprising forming a conductive via in the via opening.

5. The method of claim 1, wherein the second sub-layer is SiOC.

6. The method of claim 1, wherein the first sub-layer is a nitride.

7. A method comprising:
   depositing an etch stop layer over a conductive line;
   depositing an inter-metal dielectric (IMD) layer over the etch stop layer;
   form a via opening in the IMD layer, wherein the via opening exposes the etch stop layer;
   etching the etch stop layer to deepen the via opening, wherein the via opening in the etch stop layer does not expose both opposite sidewalls of the conductive line;
   performing an overlay measurement comprising:
   obtaining a backscattered electron image of the via opening and the conductive line; and
   determining an overlay between the via opening and the conductive line according to the backscattered electron image; and
   after performing the overlay measurement, etching the etch stop layer by using the IMD layer as an etch mask to expose the conductive line.

8. The method of claim 7, further comprising after determining the overlay between the via opening and the conductive line, forming a conductive via in the via opening.

9. The method of claim 7, further comprising:
   forming a trench in the IMD layer and connecting the via opening.

10. The method of claim 9, further comprising deepening the trench prior to obtaining the backscattered electron image of the via opening and the conductive line.

11. The method of claim 7, wherein the via opening of the IMD layer has an oblique sidewall.

12. The method of claim 7, further comprising:
    forming a testing via opening in the IMD layer when forming the via opening, wherein a size of the testing via opening is greater than a size of the via opening.

13. The method of claim 12, further comprising:
    forming a recess in the IMD layer and connecting the testing via opening.

14. A method comprising:
    forming a conductive line over a substrate, wherein the conductive line extends in a first direction;
    depositing an etch stop layer over the substrate and covering the conductive line;
    depositing an inter-metal dielectric (IMD) layer over the etch stop layer;
    form a via opening in the IMD layer, wherein the via opening exposes the etch stop layer;
    etching the etch stop layer to deepen the via opening, wherein the via opening in the etch stop layer does not expose both opposite sidewalls of the conductive line;
    performing an overlay measurement to obtain a spatial distribution of an atomic weight of the conductive line and a spatial distribution of an atomic weight of the etch stop layer; and
    after performing the overlay measurement, etching the etch stop layer by using the IMD layer as an etch mask to expose the conductive line.

15. The method of claim 14, wherein performing the overlay measurement comprises:
    emitting an electron beam to the IMD layer, the etch stop layer, and the conductive line; and
    obtaining, by using a backscattered electron detector, an image comprising the spatial distribution of the atomic weight of the conductive line and the spatial distribution of the atomic weight of the etch stop layer.

16. The method of claim 15, wherein performing the overlay measurement further comprises controlling a voltage of the electron beam such that the voltage of the electron beam is in a range of about 3 kV to about 9 kV.

17. The method of claim 15, wherein performing the overlay measurement further comprises controlling a current of the electron beam such that the current of the electron beam is in a range of about 340 pA to about 360 pA.

18. The method of claim 14, further comprising forming a trench in the IMD layer prior to performing the overlay measurement.

19. The method of claim 14, further comprising forming a conductive pattern in the via opening after performing the overlay measurement.

20. The method of claim 14, wherein the etch stop layer comprises SiOC, and the conductive line comprises copper.

* * * * *